United States Patent
Ridgers

[11] Patent Number: 5,986,487
[45] Date of Patent: Nov. 16, 1999

[54] CHARGE-PUMP CIRCUIT INTENDED FOR USE IN A FREQUENCY CONTROL LOOP OF A FREQUENCY SYNTHESIZER

[75] Inventor: Timothy John Ridgers, Bretteville l'Orgueilleuse, France

[73] Assignee: U.S. Philips Corporation, New York, N.Y.

[21] Appl. No.: 08/995,474

[22] Filed: Dec. 22, 1997

[30] Foreign Application Priority Data

Dec. 31, 1996 [FR] France ..................... 96 16264

[51] Int. Cl.[6] .......................................... H03L 7/06
[52] U.S. Cl. ............................. 327/157; 327/482
[58] Field of Search ........................ 327/157, 148, 327/102, 482, 484

[56] References Cited

U.S. PATENT DOCUMENTS

| | | | |
|---|---|---|---|
| 4,322,643 | 3/1982 | Preslar | 307/528 |
| 4,814,726 | 3/1989 | Byrd et al. | 331/1 A |
| 5,184,028 | 2/1993 | Zobel | 307/270 |
| 5,465,061 | 11/1995 | Dufour | 327/112 |
| 5,475,326 | 12/1995 | Masuda | 327/157 |
| 5,532,636 | 7/1996 | Mar et al. | 327/543 |
| 5,546,045 | 8/1996 | Sauer | 327/561 |
| 5,646,563 | 7/1997 | Kuo | 327/157 |
| 5,699,020 | 12/1997 | Jefferson | 331/17 |
| 5,734,279 | 3/1998 | Bereze | 327/112 |
| 5,783,972 | 7/1998 | Nishikawa | 331/17 |
| 5,801,578 | 9/1998 | Bereze | 327/536 |
| 5,825,226 | 10/1998 | Ferraiolo | 327/250 |

FOREIGN PATENT DOCUMENTS

0606772  7/1994  European Pat. Off. .

*Primary Examiner*—Kenneth B. Wells
*Assistant Examiner*—Maria Hasanzadah
*Attorney, Agent, or Firm*—Dicran Halajian

[57] ABSTRACT

This circuit includes an output stage consisting of a current source SCE 52 and a current sink SNK 51 having an identical construction. A reference signal is applied to a D-type flipflop 40A and a local oscillator signal is applied to another flipflop 40B of the same type. The output 28 (27) of the flipflop 40A (40B) triggers a control circuit 30A (30B) whose output C-SCE (C-SNK) controls the current source SCE (SNK). The inputs of a logic gate 60 are connected to the control circuits 30A, 30B, and the gate supplies an inactive state reset signal to the flipflops 40A and 40B and the control circuits 30. Bias voltages which are common for the control circuits are generated by a circuit 20 which also fixes the elementary output current of the charge pump.

13 Claims, 4 Drawing Sheets

CHARGE-PUMP CIRCUIT INTENDED FOR USE IN A FREQUENCY CONTROL LOOP OF A FREQUENCY SYNTHESIZER

BACKGROUND OF THE INVENTION

The invention relates to a charge-pump circuit intended for use in a frequency control loop of a frequency synthesizer provided with a local oscillator and a reference oscillator, said charge-pump circuit comprising an integration capacitor, a controlled output pull-up current-source and a controlled output pull-down current source.

The invention also relates to an integrated circuit comprising a charge-pump circuit.

The invention further relates to a radiowave receiver comprising a synthesizer with a charge pump, for example, a radio or television receiver, or a radio-telephone (all types: GSM, DECT, CT2, etc.).

A charge-pump circuit as described in the opening paragraph is known from the document U.S. Pat. No. 5,184,028 (Don W. Zobel).

The frequency control loop of a frequency synthesizer comprises a charge pump which serves in known manner for pull-up or pull-down of a capacitor whenever it detects a phase error in one sense or another between the local oscillator signal and the reference oscillator signal. The charge pump is thus used for compensating phase deviations. Its operation is critical with a view to noise, because the error signal is used as frequency reference for processing the useful signal.

Ideally, the current sources of the charge pump supply current pulses of a very short duration, for example, of the order of several nanoseconds, of a controlled amplitude and a great spectral purity. If the result of the summation of the two pulses with an equal amplitude but an opposite polarity is zero, this is not equally the case for their summation in terms of noise. Certain noise contributions are correlated between the two sources and their sum is zero. Other parts are due to independent noise mechanisms whose noise values are added. This residue limits the quality of the signal from the oscillator.

SUMMARY OF THE INVENTION

It is, inter alia, an object of the invention to provide a charge-pump circuit having a minimized noise contribution.

To this end, one of the output current sources has a control input connected to the output of a first control circuit which is connected to the output of a first flipflop having an input which is connected to the signal from the local oscillator and the output of which is connected to the first control circuit for applying a start-signal thereto, the other output current source has a control input connected to the output of a second control circuit which is connected to the output of a second flipflop having an input which is connected to the signal from the reference oscillator and the output of which is connected to the first control circuit for applying a start-signal thereto, the two control circuits have an identical construction and each current source comprises a basic source having an identical construction for the two current sources, and this in such a way that the current produced thereby is fixed by the signal supplied by the corresponding control circuit, and comprises an adjustment circuit for supplying, jointly for the two control circuits, bias voltages and a reference current.

The invention is based on the idea of using elements with noise sources correlated in such a way that they cancel each other. Due to the identity of construction between the elements of the adjustment circuit and the analog elements of the control circuits, the quality of the control signal is improved.

Advantageously, the pump circuit also has a logic gate with two inputs which are respectively connected to an end-signal output of the first control circuit and to an end-signal output of the second control circuit, and with an output which is connected to an input for resetting each of the two flipflops and each of the two control circuits to an inactive state.

The noise generated by the gate is transmitted simultaneously through the two paths and is thus canceled out.

Advantageously, a control circuit comprises a current source consisting of a source transistor arranged in series with a resistor, which source transistor is controlled by a differential pair consisting of transistors having a polarity which is opposite to that of the source transistor and bases which receive a symmetric signal from the flipflops to which the control circuit is connected, one of the transistors of the pair controlling the base of the source transistor and the other controlling the emitter of the source transistor.

The source transistor can thus be switched more rapidly.

A control circuit advantageously comprises a current source whose current is introduced into a current mirror arrangement comprising a circuit of the $V_{be}$ multiplier type.

The upstream noise is thus attenuated by the mirror.

The mirror advantageously comprises a current-generating transistor which supplies a current to a pair of two transistors operating in a cascode mode and having bases which receive the two components of the output signal from the logic gate, said signal being symmetric.

The pull-up and pull-down currents can be stopped more rapidly by switching the current of the mirror in the cascode mode.

The collector of a first transistor in the cascode mode is advantageously connected to a power supply by means of a load resistor, the collector of the second transistor is connected to the power supply by means of a parallel arrangement of a transistor arranged in a diode configuration and two series-arranged resistors, the common point between the load resistor and the collector connected thereto constitutes the output of the control circuit, which output is connected to a control input of one of the output current sources, and the common point between the two series-arranged resistors is connected to the collector of a transistor with its emitter connected to the output of the control circuit and the base biased by a reference voltage, the latter common point constituting the end-signal output.

The pump circuit is advantageously provided with means for activating or deactivating the control circuits.

The current permanently used by the synthesizer is thus smaller.

Each flipflop which supplies a start-signal advantageously comprises two transistor followers for supplying the two components of the control signal, and each of these two transistor followers is one of the transistors of a differential pair, while the other transistor is connected to a test signal input.

Such an arrangement provides a powerful test means at low cost.

In an integrated circuit comprising a charge-pump circuit, and in a radiowave receiver comprising a synthesizer with a charge-pump circuit, this circuit is advantageously a charge-pump circuit according to the invention.

These and other aspects of the invention are apparent from and will be elucidated with reference to the embodiments described hereinafter.

DESCRIPTION OF THE PREFERRED EMBODIMENTS

Figure 1:
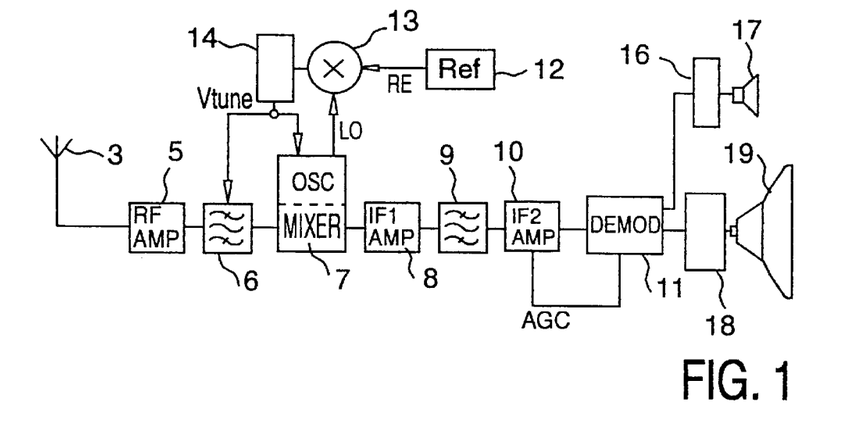
FIG. 1 shows diagrammatically a radiowave receiver, for example a television receiver.

The radiowave receiver shown by way of example in FIG. 1 is a television receiver in this case, but the invention is also applicable to any other apparatus provided with a charge-pump circuit, inter alia, a radio-telephone.

The receiver comprises successively an antenna 3, an RF amplifier 5, possibly a bandpass filter 6 having an adjustable frequency, a mixer or frequency changer 7 comprising a local oscillator, a first IF amplifier 8, a bandpass filter 9 of the surface-wave type having a fixed frequency, a second IF amplifier 10, a demodulator 11 whose output supplies demodulated signals to a video-processing circuit 18 feeding, for example, a cathode ray tube 19, and to an audio-processing circuit 16 feeding, for example, a loudspeaker 17.

The local oscillator is driven by a frequency synthesizer "PLL" which comprises in known manner a phase control loop with a phase comparator 13 which compares the frequency of the signal LO from the local oscillator with that of the signal RE from a quartz reference oscillator 12 and supplies, via a low-pass filter 14, a control voltage "Vtune" used for adjusting the frequency of the local oscillator and for adjusting the filter 6.

Several elements of this assembly may be jointly realized in the form of an integrated circuit notably comprising the element which supplies the control voltage of the local oscillator, and provided with perfections which will now be described.

The element 13 comprises a charge-pump circuit used for pulling-up or pulling-down a capacitor whenever there is a phase error between the signals LO and RE.

Figure 2:
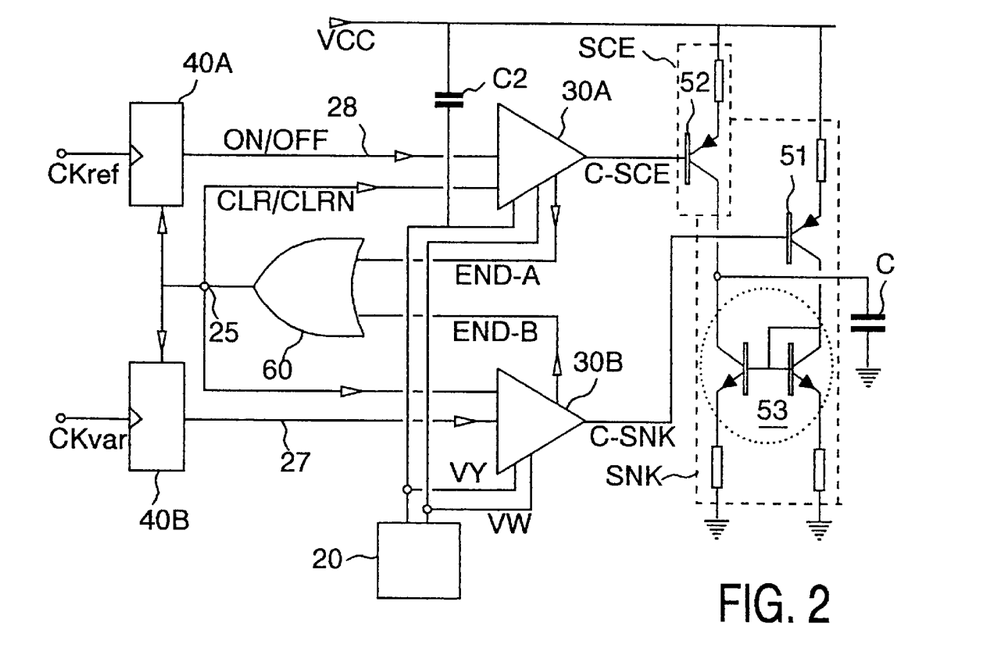
FIG. 2 shows diagrammatically a charge-pump circuit according to the invention.

FIG. 2 shows the overall structure of this charge pump which is connected between a power supply VCC and ground. It comprises an output stage comprising output pull-up current-source SCE and an output pull-down current-source SNK. This output stage is realized for SCE with the aid of a basic current source realized by means of a transistor 52 having its emitter connected via a resistor to the power supply VCC and the base controlled by the signal C-SCE from the control circuit 30A, and, for SNK, with the aid of a basic current source having an identical construction realized by means of a transistor 51 which is controlled by the signal from the control circuit 30B and with its current "returned" by a current mirror 53 at the ground side. In practice, each source is actually constituted by "n", for example sixteen, parallel-arranged basic source units. The value of the current produced is a function of the value of the control voltage C-SCE or C-SNK with respect to the power supply VCC. The currents of these two sources SCE and SNK are subtracted to each other at the output, in a capacitor C whose charge voltage represents said control voltage.

The signal from the reference oscillator is applied to the clock input Ckref of a flipflop 40A of the D-type, and the signal from the local oscillator is applied to the clock input Ckvar of another flipflop 40B of the same type. These flipflops are of the D-type but may be not entirely D-flipflops: they are triggered at a clock pulse CK/CKN but are reset to their initial state by the asynchronous control signal CLR/CLRN. The pulsation of the output current is initiated by the flipflops 40A, 40B. Taking the strong capacitance at the bases of the transistors of the current sources of the output stage into account, an interface having an appropriate fan-out, referred to as control circuit, is each time inserted between the flipflops and the output stage. The output signal 28 from the flipflop 40A is thus applied to an input of a control circuit 30A whose output C-SCE controls the output pull-up current-source SCE, and the output signal 27 from the flipflop 40B is applied to an input of a control circuit 30B whose output C-SNK controls the output pull-down current source SNK. When there is no phase error, the two sources cancel each other. The charge transferred in a comparison cycle is proportional to the phase error.

A logic gate 60 of the OR-type has two inputs which receive a signal detecting the end of conductance of the source SCE, which signal is supplied by the control circuit 30A, and a signal detecting the end of conductance of the source SNK, which signal is supplied by the control circuit 30B. Its output is simultaneously connected to the flipflops 40 and the control circuits 30. Each of the two flipflops 40A or 40B applies a start-signal to the associated control circuit and is reset to an inactive state by a signal 25 from the logic gate 60 when the two output currents of the sources SCE and SNK are present simultaneously. The signal 25 simultaneously switches to cascode-arranged transistors in each control circuit 30. The noise introduced by the gate 60 is simultaneously transmitted through the two paths in a correlated manner and is thus canceled out at the output of the charge pump.

For the sake of simplicity, the conductors 25, 27, 28 are indicated by simple connections; in practice, these are symmetric signals conveyed by two conductors which, as far as conductor 25 is concerned, are denoted by CLR and CLRN in the subsequent description of the control circuit 30A, and by ON and OFF as far as the conductor 28 is concerned.

Bias voltages VW, VY which are common for the control circuits 30 are supplied from an adjustment circuit 20 which determines the elementary output current of the charge pump independently of temperature and power supply variations. The voltage VY is decoupled by a capacitor C2 connected to the power supply VCC.

Figure 3:
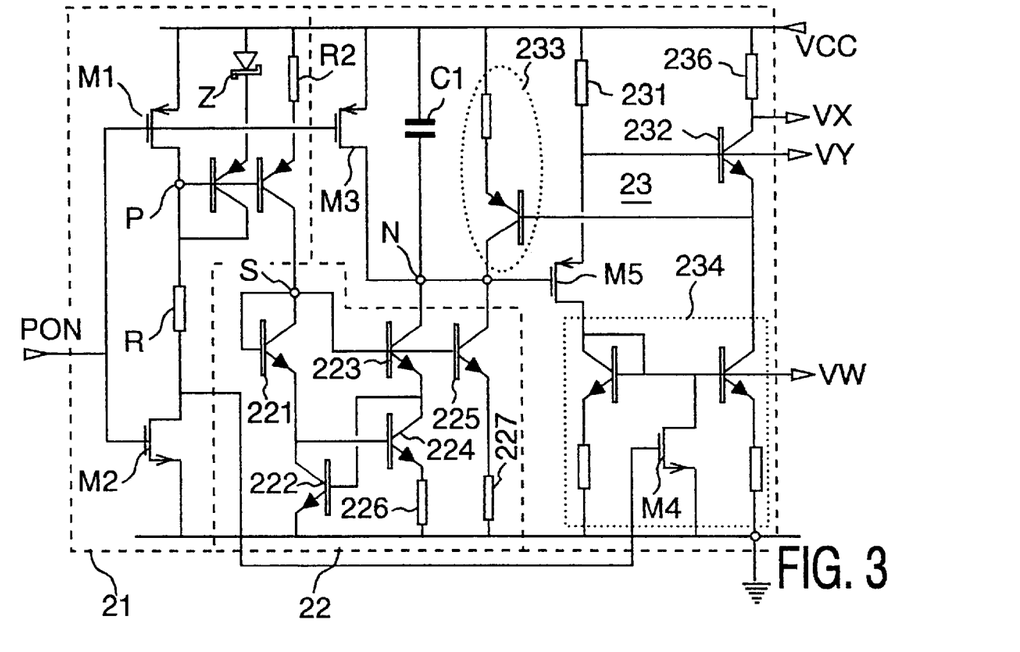
FIG. 3 is a detailed diagram of the module 20 of FIG. 2.

The adjustment circuit 20 shown in FIG. 3 realizes the unit-reference current at the output of the charge pump as well as the bias voltages of the control circuits. It comprises three parts 21, 22, 23. One part 21 is provided for starting or stopping the cell. It receives a start/stop control signal PON which turns on one or the other of the MOS transistors M1 or M2. When PON is in the high state, the transistor M2 is turned on and the current in the resistor R is copied by a preadjusted current mirror, i.e. with a Schottky diode Z in the emitter connection of its pilot transistor, and a resistor R2 in the emitter connection of its current source transistor. This mirror, connected at the point P, applies a current to the transistor 221 which is arranged in a diode configuration in the part 22. The part 22 is known per se: it is based on the fact that the transistors 221 and 224 each consist of, for example, four basic transistors arranged in parallel and are thus much larger than the single transistors 222 and 223. Starting from the point S, the $V_{be}$ of the two series-arranged transistors 222 and 223, on the one hand, and the base-emitter junctions of the transistors 221 and 224, on the other hand, generate voltages which are not equal because the two transistors 221 and 224 are larger, and the difference is applied at the terminals of the resistor 226. This voltage determines the current in the resistor 226 and the transistors 224 and 223, and another branch consisting of the transistor 225 arranged in series with the resistor 227 also provides a current that is added to the latter in the node N. Provided that the weighting between the current in the transistor 223 and that in the transistor 225 is well chosen, the sum of the currents thus produced yields a current which is independent of temperature and the power supply voltage.

This unit-reference current reaches the composed current mirror 23. This mirror comprises a first follower stage consisting of a transistor MS of the P-MOS type charged by a resistor 231 from which the voltage VY is taken, a second follower stage 232 of the NPN type also comprising a collector resistor 236 from which a voltage VX intended for the gate 60 is taken, and a feedback current source 233. The collector current of the first follower stage M5 is recovered in a current mirror 234 for supplying the current bias for the NPN follower stage 232, and the voltage reference VW. This allows a reduction of the number of required circuits.

To avoid a detrimental influence on the current which is permanently consumed by the synthesizer, the control circuits are only activated during a part of the time, for example during scanning periods in the case of a radio-telephone in the standby state. When the signal PON has a low value, a transistor M4 short-circuits the mirror 234 and a transistor M3 takes the current from the node N. A capacitor C1 of approximately 2 pF between the power supply VCC and the node N ensures the stability of the circuit.

The source 233 is matched, i.e. given an identical construction, with those from which the output stage is realized. Similarly, the follower stage 232 is matched with two limiter transistors of the control circuit, which will be described hereinafter. Because of these matchings, the currents produced by the sources SCE and SNK are reflections, at an approximate scale, of the unity reference current produced by the adjustment circuit of FIG. 3.

Figure 4:
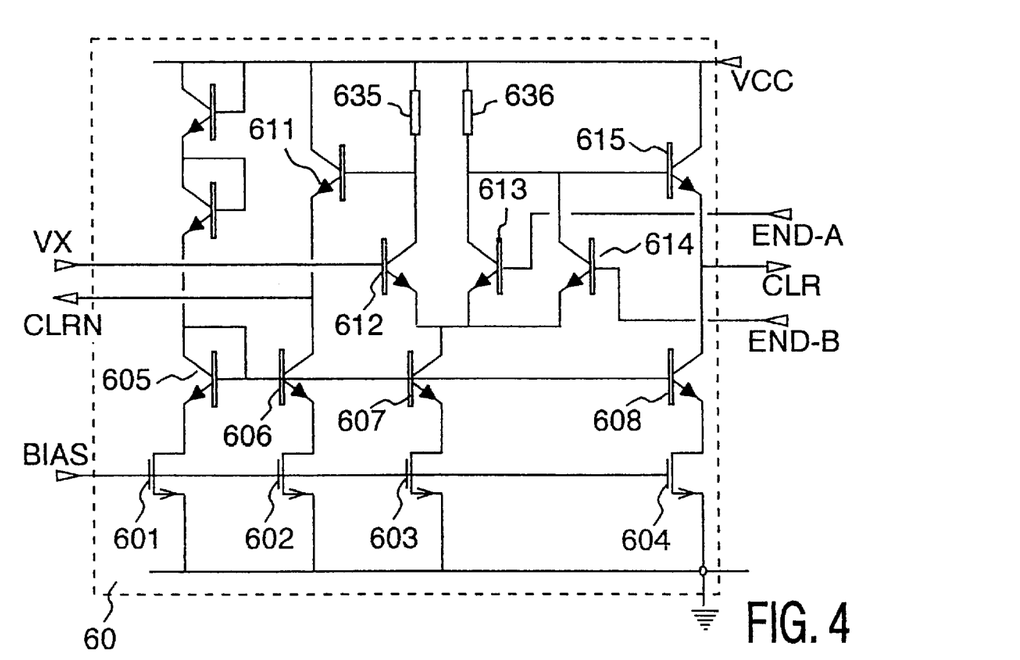
FIG. 4 is a detailed diagram of the module 60 of FIG. 2.

The module 60 shown in FIG. 4 is provided with a plurality of MOS transistors 601–604 which are biased by a voltage BIAS and are connected in cascade to transistors 605–608, respectively. When the power supply voltage is less than approximately 3.5 V, these MOS transistors 601–604 serve as resistors for defining the current for mirror transistors 606–608 which, together with a pilot transistor 605, constitute current sources. The MOS transistors 601–604 and mirror transistors 605–608 function in the cascode mode. The module essentially comprises an assembly which is analogous to a differential pair but comprises two transistors on oneside ends: the current source transistor 607 is connected to the pair constituted by the transistor 612 on one side and the transistors 613, 614 on the other side. The base of the transistor 612 is fed by the reference voltage VX supplied by the adjustment circuit 20. The bases of the transistors 613 and 614 are fed by the symmetric voltages END-A and END-B, respectively, from the adjustment circuit 20, indicating the end of conductance of a source SCE or SNK. The collectors of the transistors 613, 614 are jointly connected to the power supply VCC via a resistor 636, and the collector of the transistor 612 is connected to the power supply VCC via a resistor 635. The voltage at the resistor 636 is applied to the base of the transistor 615 arranged as an emitter follower which is charged by the current source 608 and supplies the signal CLR. The voltage at the resistor 635 is applied to the base of the transistor 611 arranged as an emitter follower which is charged by the current source 606 and supplies the signal CLRN.

Figure 5:
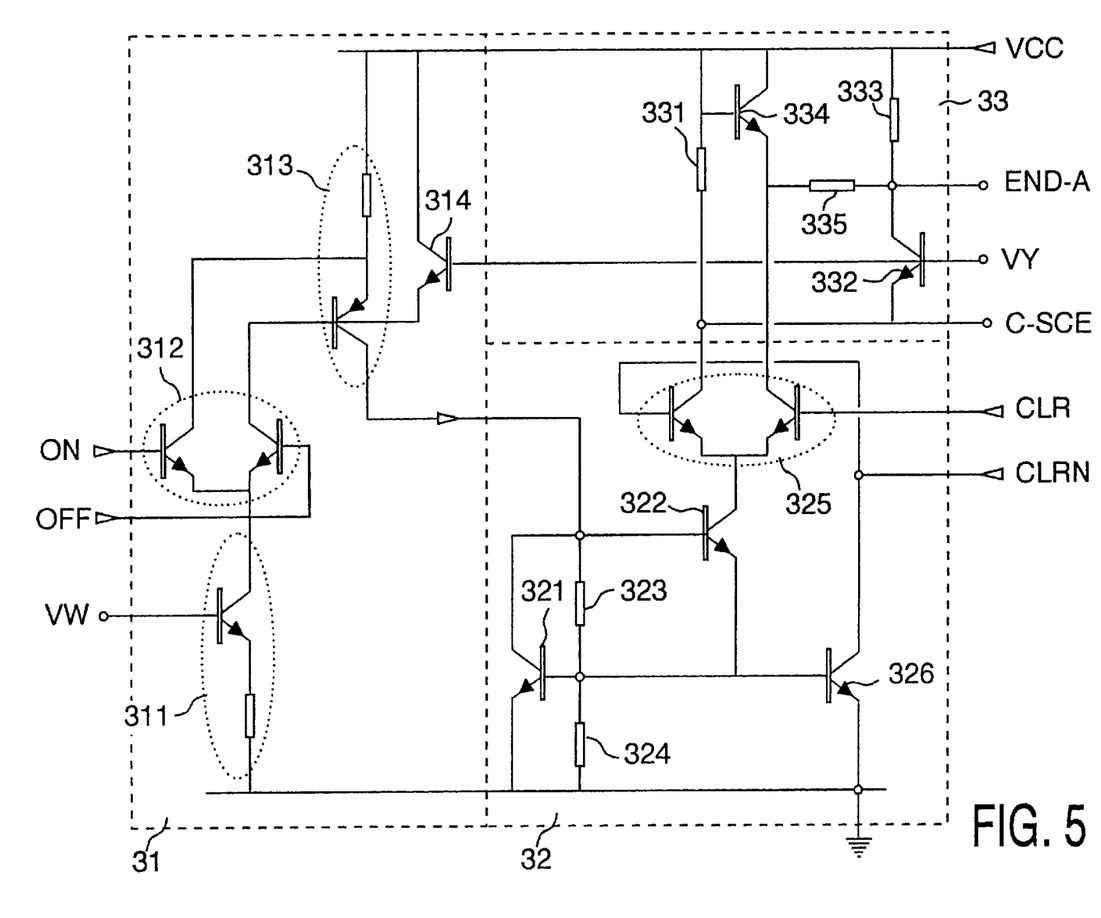
FIG. 5 is a detailed diagram of the module 30A of FIG. 2.

The control circuit 30A is shown in FIG. 5. The control circuit 30B is identical, replacing "A" by "B" and "SCE" by "SNK". It has three parts 31, 32, 33.

The part 31 ensures the start and comprises a current source 313 comprising a PNP transistor, called source transistor, arranged as an emitter follower with a load resistor to the power supply VCC, which transistor is abruptly controlled together at the emitter and the base by the currents coming from a differential NPN pair 312 controlled by the symmetric output ON/OFF of one of the flipflops 40A or 40B and fed by a current source 311 receiving the reference voltage VW supplied by the adjusting circuit 20. The current source 313 is identical to the source 233 of the adjusting circuit, and the current source 311 is identical to that of the mirror 234 of the adjusting circuit; they are thus subject to the same temperature-law, the same noise level and the same variation with the resistance per square of the process; when the source 313 is active, its current has all the electrical properties of the unit-reference current of the adjustment circuit. The base of the PNP transistor is connected to the emitter of a NPN transistor 314 having its base biased by the voltage VY supplied by the adjusting circuit and the collector connected to the power supply VCC. These circuits must act in a few nanoseconds. The part 31 creates a current which is switched rapidly and comes from the source 313 which activates the current source 32. When the source 313 is at rest, the pair 312 is biased in such a way that the current from the source 311 flows through that one of the transistors which is connected to the emitter of the PNP transistor, and the collector of the other transistor passes only a very small current to the base of the PNP transistor, while the values of the elements are chosen in such a way that the potential at the emitter of the PNP transistor is close to that reached in the opposite state (active source 312). When there is a switching, the PNP transistor thus simultaneously receives a current entering its emitter and a considerable amount of current at its base, and the PNP transistor is turned on very rapidly. The stop follows the inverse steps and is equally rapid.

The current from the control circuit, which is used for starting the output stage SCE, must have a high quality as regards noise. This characteristic feature is ensured by the part 32 comprising a transistor 321 with a resistor 323 connected between its collector and base, and a resistor 324 connected between its base and emitter. The base-emitter junction of a transistor 326 is connected in parallel with that of the transistor 321, and that of a transistor 322 is connected in parallel with the base-collector junction of the transistor 321. A voltage which is equal to $V_{be}$ of the transistor 321, plus $V_{be}$ of transistor 322, is present at the collector of transistor 321. This arrangement is traversed by the current from the current source 313 whose behavior is matched with that of the adjustment circuit. The current from the source 313 is divided into three parts: the base current of the transistor 322, a bias current in the resistor 323 and a residue which flows in the transistor 321 connected as a current mirror. The resistor 324 determines the output current of the mirror. The current first flowing through the resistors 323, 324 biases the base-emitter junction of the transistor 322 and that of the transistor 321. The emitter of the transistor 322 thus holds a voltage which is equal to $V_{be}$ of the transistor 321, which voltage is also applied to the resistor 324 whose value will be referred to as $R_{324}$. The output current of the part is thus substantially equal to $V_{be}/R_{324}$. In a first approximation, by virtue of the low dynamic impedance of the transistor 321, this current is little dependent on the input current from the source 313, which results in attenuating the effect of certain sources of noise which would normally be amplified in a conventional arrangement of a current mirror. Since the components have small dimensions with low capacitances, the starting time is as rapid as that of the PNP transistor of the current source 313. The transistor 326 has the effect of drawing current at the input of the signal CLRN, which allows this signal to decrease at a faster rate when the transistor 611 of the gate 60 is turned off. The transistor 326 is turned on when the source 313 supplies a current and is thus turned on at the instant when the gate 60 resets the signal CLRN.

A stage 325 consisting of two cascode-arranged transistors is switched by the two signals CLR/CRLN from the gate 60 and is installed at the output of the current source 32. This stage switches the current either to the output C-SCE or to a charge network which will be described hereinafter. The current from one of the collectors of the transistors 325 is applied to the output terminal C-SCE of the control circuit which terminal is connected to the base of the transistor of the output current source SCE. The amplitude adjustment of the output current of the pump is ensured by an NPN limiter transistor 332. This transistor receives the desired value of the current by means of the control voltage VY generated by the adjustment circuit 20, which voltage is applied to its base. The collector is connected to the power supply VCC by means of a resistor 333 and the emitter is connected to the output C-SCE. The above-mentioned charge network comprises an NPN transistor 334 arranged in a diode configuration and connected to the power supply VCC, a resistor 335 connecting the emitter of this transistor to the collector of the transistor 332 which is connected to the connection END-A (connected to an input of the gate 60 of FIG. 4), and the resistor 333. When the control circuit is started, the current from the source 32 first serves to charge the capacitance of the base of the transistor of the output current source SCE. When the voltage starts establishing at this base, a part of the current is deviated in the resistor 331 and the voltage decreases until the emitter voltage of the transistor 332 is low enough for this transistor to start conducting, and brings the output END-A to a low state. When the two control circuits 30A and 30B detect the start of the two sources SCE and SNK, indicated by a low state at the output END-A of the circuit 30A and at the corresponding output END-B of the circuit 30B, the OR gate 60 provides a high state at its output CLR and a low state at its output CLRN which controls the flow of current in the transistor 334, while continuing to ensure a low state at the output END-A by virtue of the two resistors 335 and 333. After switching of the pair 325, only the pull-up resistor 333 can contribute to the noise at the output.

The current sources of the control circuit 30 are identical to those used in the adjustment circuit. The fan-out of the pump is thus equal in both directions and is defined, on the one hand, by the unit-reference current of the adjustment circuit and, on the other hand, by the ratio "n" of the number of transistors constituting the sources SCE and SNK, independently of the amplitude of the pulsed current from the control circuits 30. When the transistor 332 is active, it has a lower impedance at its emitter at the node C-SCE, which results in attenuating the noise sources upstream. The noise which is inherent in the control voltage is simultaneously introduced into the two paths but with opposite polarities, which leads to a cancellation at the output of the pump. The transistor 332 is rapidly turned on when its emitter-voltage reaches a threshold corresponding to the sum of the control voltage applied to its base, plus a voltage $V_{be}$. The more the voltage falls below the threshold, the more the current from the stage 325 is directed in the resistor 333. The voltage at the node C-SCE thus varies to a small extent. Shunting the excess current in the source 32, which is not used as a base current for the transistors 51 or 52 of the output stage, nor for biasing the node C-SCE via the resistor 331, generates a voltage ramp at the output END-A. As the resistor 333 is of the same order as 331, this ramp is as steep as the excess current is important and as the parasitic capacitance of the node END-A is smaller than that of the node C-SCE. The result is a signal detecting the end with great rapidity and excellent sensitivity.

Figure 6:
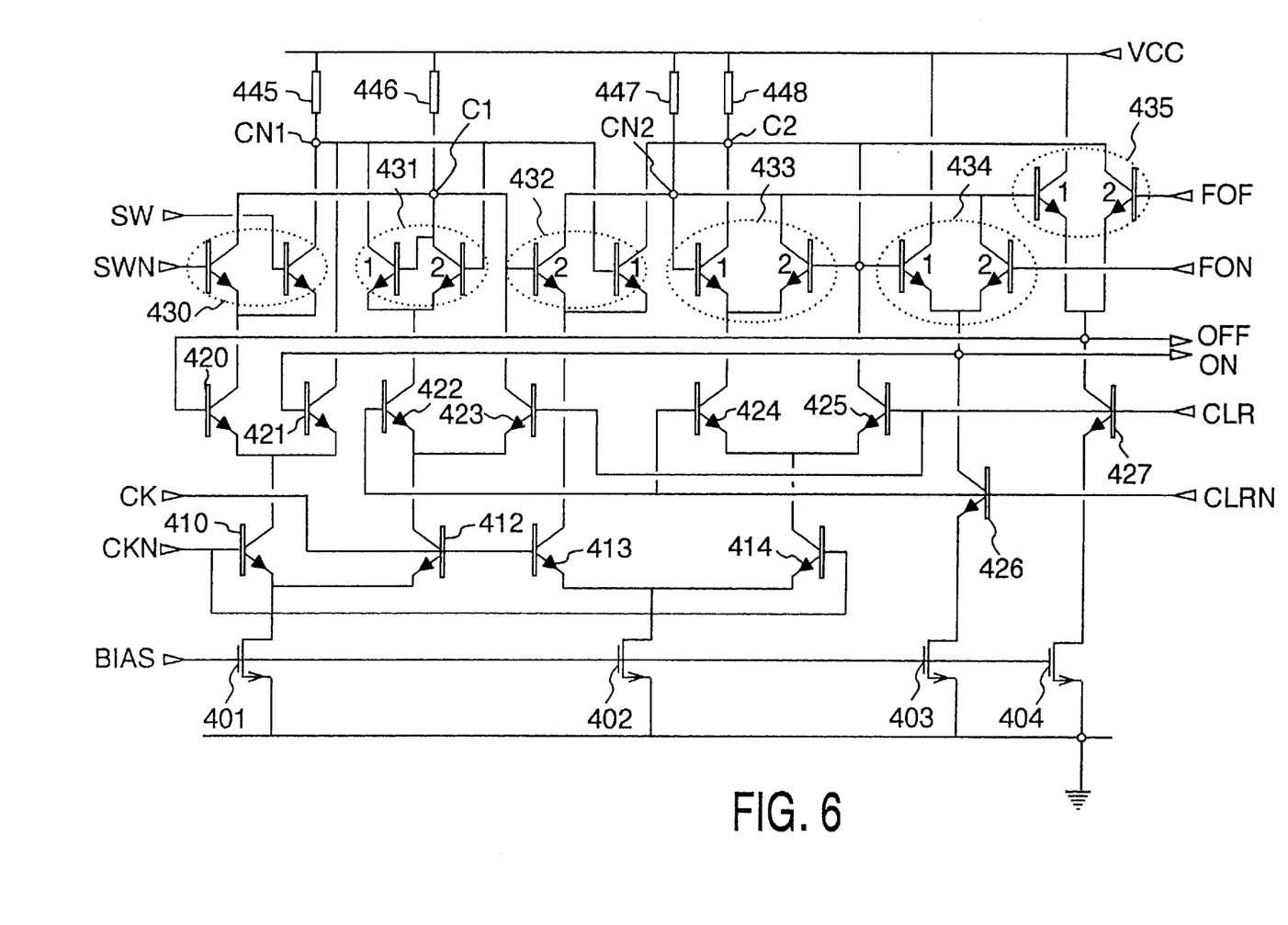
FIG. 6 is a detailed diagram of the module 40B of FIG. 2.

The flipflop 40B, shown in FIG. 6, is realized with the aid of differential CML gates. It is provided with two MOS transistors 401 and 402 which are biased by a voltage BIAS and serve as a tail-resistance for two pairs 410/412 and 413/414, both controlled at the input by a symmetric clock signal CK/CKN which corresponds to the signal CKvar of FIG. 2. The collector of transistor 412 feeds a current to a pair of transistors 422/423 which are switched by connecting their bases to the symmetrical signals CLR/CLRN for defining a state, from the gate 60. The collector of the transistor 413 feeds a current to a pair 432 and that of the transistor 414 feeds a current to a pair of transistors 424/425 which are also switched by connecting their bases to the symmetrical signal CLR/CLRN. The collector of the transistor 422 feeds a current to a pair 431. The collector of a first transistor of the pair 431 and the base of the other transistor as well as the base of a first transistor of the pair 432 are connected to a connection CN1 which is connected to the power supply VCC via a resistor 445. The collector of the second transistor and the base of the first transistor of the pair 431 as well as the base of the second transistor of the pair 432 are connected to a connection C1 which is connected to the power supply VCC via a resistor 446. The collector of a first transistor and the base of the other transistor of a pair 433 as well as the collector of the first transistor of the pair 432 are connected to a connection C2 which is connected to the power supply VCC via a resistor 448. The collector of the second transistor and the base of the first transistor of the pair 433 as well as the collector of the second transistor of the pair 432 are connected to a connection CN2 which is connected to the power supply VCC via a resistor 447.

The collector of the transistor 423 is connected to the connection C1, that of the transistor 424 feeds a current to the pair 433 and that of the transistor 425 is connected to the connection C2. The flipflop thus comprises a first pair of transistors 431 constituting a first semi-flipflop supplying a first logic signal at a first couple of logic connections C1, CN1, a second pair of transistors 433 constituting a second semi-flipflop supplying a second logic signal at a second couple of logic connections C2, CN2, the two pairs being coupled together by means of a pair 432 for jointly constituting a complete flipflop, and the second couple of logic connections C2, CN2 constituting an internal output of the logic signal of the flipflop, in the symmetrical mode.

The flipflop comprises a system for enforcing states intended to test the pump. The pairs 434 and 435 are provided for this object. Two MOS transistors 403, 404 are biased by the voltage BIAS. When the power supply voltage is less than approximately 3.5 V, these transistors serve as resistors for defining the current for transistors 426, 427 constituting current sources and serving as tail-resistance for a pair 434 and a pair 435. As in this case, the bases of the transistors 426, 427 may be connected to the connection CLR/CLRN if the topography of the circuit simplifies this connection, but this does not play any functional role because the voltage CLR, CLRN always keeps such a value that these transistors remain conducting. The transistors 434-1 and 435-1, functioning as emitter followers, supply the output signals ON and OFF, i.e. the two components of the output signal from the internal output C2/CN2. These signals activate one of the control circuits 30A or 30B. The two transistor followers are each transistors of a so-called enforcing pair, with the bases of the other transistor 434-2 and 435-2 connected to test signal inputs FON and FOF, respectively. As the base of the transistor 435-1 of the enforcing pair 435 is connected to the logic connection CN2 constituting an internal semi-output, the collector of the other transistor 435-2 of the same pair 435 is connected to the other connection C2. The reciprocal applies mutatis mutandis to the pair 434.

An enforcement could be obtained by means of the connections CLR/CLRN but then the possibilities would be reduced: one could only enforce a single state and one would only be able to act on the two flipflops at the same time because the connection CLR/CLRN is common for the two flipflops while the pairs 434, 435 allow all combinations.

The signals FON and FOF are normally low and the second transistors of the pairs 434 and 435 are cut off and do not modify the operation at all. In the test mode, one or the other of these signals is given the active state, and the respective output changes to the state "1", irrespective of the positioning of the flipflop. Since the collector of the transistor 434-2 is connected to the connection CN2, i.e. the output which is opposite to the output ON controlled by 434-1, the flow of current through this transistor imposes a voltage drop in the resistor 447 such that the opposite output is simultaneously set to the zero state. The reciprocal applies mutatis mutandis to the pair 435. By forcing the other elements in a known stable state, all this allows verification of different characteristics of the pump, such as the amplitude of the output currents of the sources SCE and SNK.

The flipflop also has a control input SW/SWN which is connected to the bases of a pair of control transistors 430 having their collectors connected to the two conductors C1 and CN1, respectively, of the first couple of logic connections. The emitters of the control transistors 430 are connected to the collector of a transistor 420 of a pair of transistors 420/421, fed by the transistor 410, and whose bases are connected to the output connections ON/OFF of the flipflop. The collector of the transistor 421 is connected to the connection CN1. The gates 431, 432 need the prepositioning of the signal SW/SWN: this signal allows the use of only an edge of the signal CK/CKN per period of comparison, while the others are not accepted. The choice of the active edge is calculated in a computer (outside the pump circuit) which applies a selection pulse to the input SW/SWN of the flipflop. The comparison frequency is thus a sub-multiple of the oscillator frequency. As from the instant when the flipflop is activated, the state is maintained during the subsequent clock cycles, even if the input SW is reset, as long as the input CLR/CLRN is not reset.

In another embodiment, the flipflop may not comprise the pair 430 nor the pair 420/421, the collector of the transistor 410 then being connected directly to the connection CN1. In the circuit shown in FIG. 2, the flipflop 40B comprises these elements, but the flipflop 40A does not. In accordance with the options chosen, notably whether an exterior counter supplying a selection pulse is used, the four combinations may be used (the two circuits 40A and 40B with elements, the two without elements, 40A with elements and 40B without elements, and conversely).

What is claimed is:

1. A charge-pump circuit intended for use in a frequency control loop of a frequency synthesizer provided with a local oscillator and a reference oscillator, said charge-pump circuit comprising an integration capacitor, a controlled output pull-up current source and a controlled output pull-down current-source, wherein one of the output current sources has a first control input connected to a first control output of a first control circuit which is connected to a first flipflop output of a first flipflop for providing a first start-signal to said first control circuit, said first flipflop having a first flipflop input which is connected to the local oscillator; and wherein another of the output current sources has a second control input connected to a second control output of a second control circuit which is connected to a second flipflop output of a second flipflop for providing a second start-signal to said second control circuit, said second flipflop having a second flipflop input which is connected to the reference oscillator, wherein the first and second control circuits have an identical construction, and each current source comprises a basic source having an identical construction so that currents produced thereby are fixed by first and second control signals supplied by the first and second control circuits respectively, the charge-pump circuit further comprising an adjustment circuit for supplying the first and second control circuits with bias voltages and a reference current.

2. A charge-pump circuit as claimed in claim 1, wherein one of the first and second control circuits includes a control current source having a source transistor arranged in series with a resistor, said source transistor being controlled by a differential pair of transistors having a polarity which is opposite to a polarity of the source transistor and bases which receive a symmetric signal from the first and second flipflops, one of the transistors of the differential pair controlling a base of the source transistor and another of the transistors of the differential pair controlling an emitter of the source transistor.

3. A charge-pump circuit as claimed in claim 1, wherein one of the first and second control circuits comprises a control current source whose current is introduced into a current mirror arrangement comprising a circuit of a $V_{be}$ multiplier type.

4. A charge-pump circuit as claimed in claim 3, wherein the current mirror arrangement comprises a current-generating transistor which supplies a current to a pair of two transistors having bases which receive two components of an output signal from a logic gate, said two components being symmetric.

5. A charge-pump circuit as claimed in claim 4, wherein a first collector of a first transistor of one of said pair of two transistors is connected to a power supply by means of a load resistor, and wherein a second collector of a second transistor of another of said pair of two transistors is connected to the power supply by means of a parallel arrangement of a transistor arranged in a diode configuration and two series-arranged resistors, wherein a common point between the load resistor and the first collector constitutes one of the first and second control outputs and the common point is an end-signal output connected to an input of the logic gate.

6. A charge-pump circuit as claimed in claim 1, further including means for activating or deactivating the first and second control circuits.

7. A charge-pump circuit as claimed in claim 1, wherein each of said first and second flipflops comprises two transistor followers for supplying the first and second start-signals.

8. A charge-pump circuit comprising:
- a first control circuit which outputs a first control signal in response to a first start signal;
- a second control circuit which outputs a second control signal in response to a second start signal;
- a first input device which provides said first start signal in response to a local oscillating signal;
- a second input device which provides said second start signal in response to a reference oscillating signal;
- a first current source for providing a first current which is proportional to said first control signal;
- a second current source for providing a first current which is proportional to said second control signal; and
- a logic gate having a first logic input connected to a first end-signal output of said first control circuit and a second logic input connected to a second end-signal output of said second control circuit, a reset output of said logic gate being connected to reset inputs of said first and second input devices and of said first and second control circuits for placing said charge-pump circuit in an inactive state.

9. The charge-pump circuit of claim 8, wherein said first and second input devices are flip-flops.

10. The charge-pump circuit of claim 8, further comprising a first oscillator which provides said local oscillating signal and a second oscillator which provides said reference oscillating signal.

11. A radio receiver comprises:
- an input device for receiving modulated signals having a first frequency;
- a mixer for converting said first frequency to a second frequency and providing intermediate frequency signals; and
- a demodulator for demodulator said intermediate frequency signals;
- wherein said mixer includes a charge-pump circuit which comprises:
  - a first control circuit which outputs a first control signal in response to a first start signal;
  - a second control circuit which outputs a second control signal in response to a second start signal;
  - a first input device which provides said first start signal in response to a local oscillating signal;
  - a second input device which provides said second start signal in response to a reference oscillating signal;
  - a first current source for providing a first current which is proportional to said first control signal;
  - a second current source for providing a first current which is proportional to said second control signal; and
  - a logic gate having a first logic input connected to a first end-signal output of said first control circuit and a second logic input connected to a second end-signal output of said second control circuit, a reset output of said logic gate being connected to reset inputs of said first and second input devices and of said first and second control circuits for placing said charge-pump circuit in an inactive state.

12. The radio receiver of claim 11, wherein said first and second input devices are flip-flops.

13. The radio receiver of claim 11, further comprising a first oscillator which provides said local oscillating signal and a second oscillator which provides said reference oscillating signal.

* * * * *